United States Patent [19]
Tserng

[11] Patent Number: 5,519,358
[45] Date of Patent: May 21, 1996

[54] REACTIVELY COMPENSTAED POWER TRANSISTORS

[75] Inventor: Hua Quen Tserng, Dallas, Tex.

[73] Assignee: Texas Instruments Incorporated, Dallas, Tex.

[21] Appl. No.: 290,264

[22] Filed: Aug. 15, 1994

[51] Int. Cl.$^6$ .............................. H03F 3/14; H03F 3/60; H03F 3/68

[52] U.S. Cl. ..................... 330/307; 330/286; 330/295

[58] Field of Search .............................. 330/54, 65, 66, 330/67, 68, 286, 307, 292, 295

[56] References Cited

U.S. PATENT DOCUMENTS

| | | | |
|---|---|---|---|
| 4,733,195 | 3/1988 | Tserng et al. | 330/286 |
| 5,355,095 | 10/1994 | Nathanson et al. | 330/307 X |

OTHER PUBLICATIONS

Bayraktaroglu, et al., "5 W Monolithic HBT Amplifier for Broadband X–Band Applications," *IEEE 1990 Microwave and Millimeter–Wave Monolithic Circuits Symposium*, pp. 43–45.

Bayraktaroglu, et al., "2.5 W CW X–Band Heterojunction Bipolar Transistor," *IEEE MTT–S Digest*, pp. 1057–1060.

*Primary Examiner*—Steven Mottola
*Attorney, Agent, or Firm*—Michael K. Skrehot; James C. Kesterson; Richard L. Donaldson

[57] ABSTRACT

A transistor for amplifying a high-frequency signal comprises multiple unit transistors arranged about a center transmission line 122 and features reactive compensation 140 along the transmission line to provide signals at the output of the unit transistors which generally add in-phase. This has advantages in that a larger or more distributed transistor arrangement than can traditionally be used is made possible without incurring the gain or power degradation associated with the phase differences of signals amplified by unit transistors occurring at distant points along the center transmission line. The reactive compensation includes a capacitor 140 at the end of the transmission line 122 that may be fabricated along with the transistor as a portion of a monolithic integrated circuit.

15 Claims, 7 Drawing Sheets

REACTIVELY COMPENSTAED POWER TRANSISTORS

CROSS REFERENCE TO RELATED APPLICATIONS

This application includes subject matter which is related to U.S. patent application Ser. No. 08/290,252 (Texas Instruments, Inc. Docket No. TI-18182), filed even date herewith.

FIELD OF THE INVENTION

This invention relates generally to semiconductor devices, and more specifically to high frequency power transistors.

BACKGROUND OF THE INVENTION

High-frequency power transistors have traditionally occupied a large amount of the area available on a monolithic integrated circuit. The need for high output power generally requires that the output stage of a transistor amplifier have a very large gate or emitter periphery. The gates of MESFETs or the emitters of heterojunction bipolar transistors (HBTs) often exceed one millimeter in total periphery, and can extend across the entire width of the integrated circuit. See, for example, M. Avasarala et al., "A 2.5-Watt High Efficiency X-Band Power MMIC," *IEEE Microwave and Millimeter-wave Monolithic Circuits Symposium Digest of Papers*, 1989, pp. 25–28, and J. J. Komiak, "Octave Band Eleven Watt Power Amplifier MMIC," *IEEE Microwave and Millimeter-wave Monolithic Circuits Symposium Digest of Papers*, 1990, pp. 35–38.

An additional difficulty is that for high-frequency applications, one generally must ensure that the phase velocity along all signal paths to the power transistor is relatively constant; otherwise, signals amplified by different portions of the transistor may partially cancel one another and result in diminished output power. FIG. 1 shows a typical prior an power transistor 18 as may be used in the output stage of a power amplifier. A signal incident at input port 20 is distributed by a microstrip transmission line network 22 to the input terminals 24 (in this case the gate terminal of a MESFET) of transistor unit cells 26. The amplified signals exit the output terminals 28 (i.e. the drain terminal) of transistor unit cells 26. The signals from each of the unit cells 26 of transistor 18 are combined by a microstrip transmission line network 30, and may be extracted at the output port 32. This arrangement ensures that the phase velocity along each of the paths to and from transistor unit cells 26 is equal. The power combined at the output of the transmission line network 30 is in phase and represents the maximum power obtainable from the transistor 18 for a given bias condition and frequency. This arrangement is effective for equalizing phase velocity, but it occupies a large amount of space on an integrated circuit. The need for large transistors and extensive phase equalization circuitry combine to make high-frequency power transistor amplifiers costly. There is a need in the industry for reducing the size and the associated costs of these devices.

Closely related to these problems is that of the physical layout and size of very large transistors. Center-fed transistors, also known as the "pi ($\pi$) configuration," are known to suffer from phase differences along the central input line. This is the so-called "distributed effect," and applies to the effects of phase along the center-feed line, whether it be a gate feed or a base feed. The transistor shown in FIG. 11 is an example of a typical center-feed transistor, in this case a bipolar transistor. See also B. Bayraktaroglu et al., "5 W Monolithic HBT Amplifier for Broadband X-band Applications," *IEEE Microwave and Millimeter-wave Monolithic Circuits Symposium Digest of Papers*, 1990, pp. 43–46. In FIG. 11, the signal to be amplified is incident at base pad 120 and propagates along the input transmission line 122. The signal enters the transistor along the base fingers 124. In this example, the emitter of the transistor is coupled to ground through the backside of the substrate at the emitter pad 128, which in turn is coupled to the unit transistors by the emitter fingers 126. The amplified signal exits the unit transistors along the collector bus 130 which forms an output transmission line. The amplified output signal is then available at the output terminal 132.

This prior art arrangement performs well unless the size of the transistor is increased appreciably by adding more unit transistors along a longer input transmission line 122. As long as the transistor is much smaller than the wavelength of the signal, the phase of the signal at each of the unit transistors that comprise the overall transistor is approximately the same. However, if the size of the transistor (i.e. the length along the input transmission line) approaches approximately one-sixteenth of the guided wavelength of the signal being amplified, the phase progression of the signal along the input transmission line adversely affects the output power of the transistor. This phase limitation is an obstacle to the design of large transistors which provide high power levels at microwave frequencies. Aspects of the invention are intended to address these problems.

SUMMARY OF THE INVENTION

In accordance with the principles of the present invention, there is disclosed herein a transistor for amplifying a high-frequency signal comprising a plurality of unit transistors. Each of the unit transistors includes an input terminal and an output terminal. An input transmission line couples each of the input terminals to one another and to a reactive termination. The length from a first unit transistor to a last unit transistor along the input transmission line is less than the wavelength of the high-frequency signal. The transistor also includes an output transmission line coupling each of the output terminals to one another.

In accordance with one embodiment of the present invention the reactive termination is a capacitor. In another embodiment the capacitor is a metal-insulator-metal structure having a bottom plate coupled to ground and a top plate coupled to the input transmission line.

Further in accordance with the principles of the present invention, there is disclosed a method of fabricating a transistor for amplifying a high-frequency signal. The method comprises the step of forming a plurality of unit transistors, each of the unit transistors including an input terminal and an output terminal. Another step is coupling an input transmission line to each of the input terminals and to a reactive termination. The length from a first unit transistor to a last unit transistor along the input transmission line is less than the wavelength of the high-frequency signal. The method also includes the step of coupling an output transmission line to each of the output terminals.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 1:
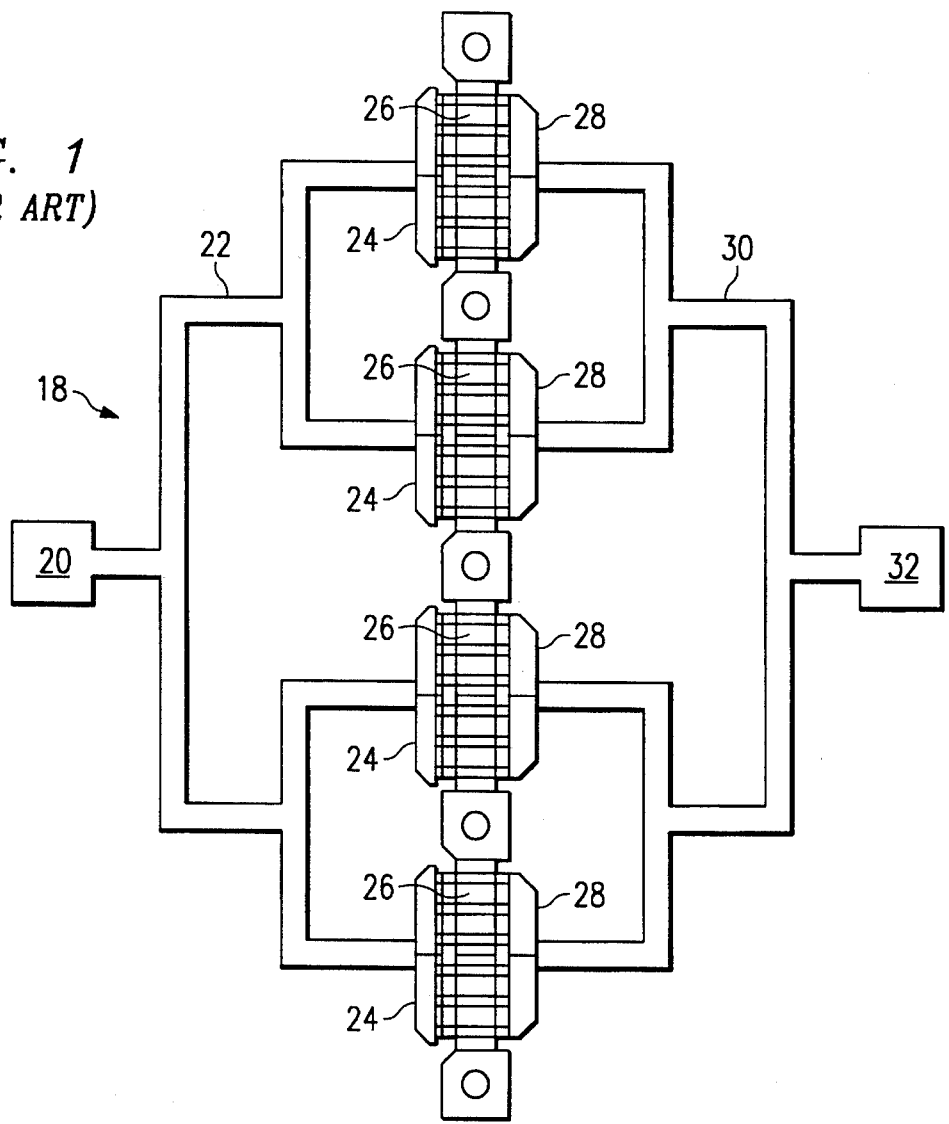
FIG. 1 is a plan view of a prior art power amplifier circuit.
Figure 2:
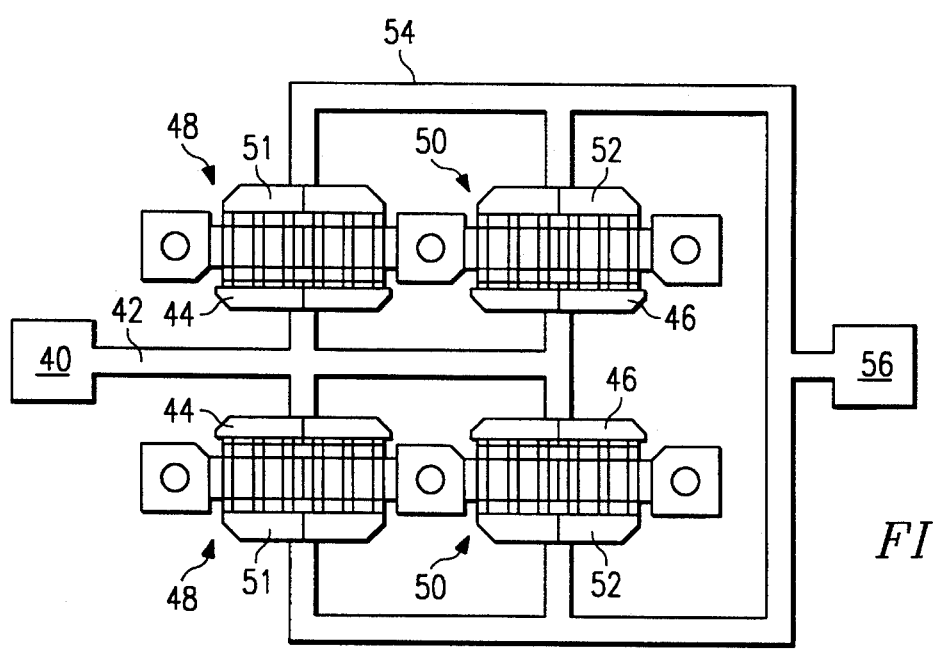
FIG. 2 is a diagram of a compact power amplifier circuit.

One approach to the problem of size presented by the prior art circuit of FIG. 1 may be to fold the transistor as shown in FIG. 2. In the circuit of FIG. 2, a signal incident at input port 40 propagates along an input transmission line 42 to a first pair of transistor input terminals 44 (in this case the gate terminal of field effect transistors 48) and then further along the line 42 to a second pair of input terminals 46. The amplified signal exits the transistors 48 and 50 at output (drain) terminals 51 and 52 and propagates along an output transmission line 54 to an output port 56. A key difference between the circuit of FIG. 1 and that of FIG. 2 is the fact that the signal propagates along different routes between the input port 40 and the output port 56. The circuit of FIG. 1 is arranged to ensure each route through the circuit is equal in length and in phase velocity. Conversely, the circuit of FIG. 2 is arranged to pack the transistor into a compact area. The route from the input port 40 to the input terminals 44 of the first transistor pair 48 is different from that between the input port 40 and the input terminals 46 of the second transistor pair 50. Similarly, the routes between the output terminals 51 of the first transistor pair 48 and the output terminals 52 of the second transistor pair are also different to the output port 56. It may be noticed that the physical distance traveled by the signal along each of the routes through either the first transistor pair 48 or the second transistor pair 50 is the same. However, the phase velocity along each of these routes is not the same.

Phase velocity is defined as $$v_p = \frac{1}{\sqrt{LC}}$$

where L and C are the inductance along the line or route and the capacitance that shunts the line or route, respectively. A field effect transistor, such as a MESFET, has a higher input capacitance than output capacitance. Consequently, the route from input port 40 to output port 56 through transistors 48 has a different combination of input and output inductance and capacitance than does the route through transistors 50. This results in a phase velocity difference between the two routes. The maximum power and gain of the circuit of FIG. 2 is produced when the signals at the output of transistor pairs 48 and 50 combine in phase. Since the phase velocity differs between the route through the first 48 and second transistors 50, the combined gain of the transistor pairs will be less than would be possible if the combined signals were in phase. It may be appreciated that a circuit incorporating bipolar transistors encounters similar problems, but in a bipolar transistor the input capacitance is generally lower than the output capacitance.

Figure 3:
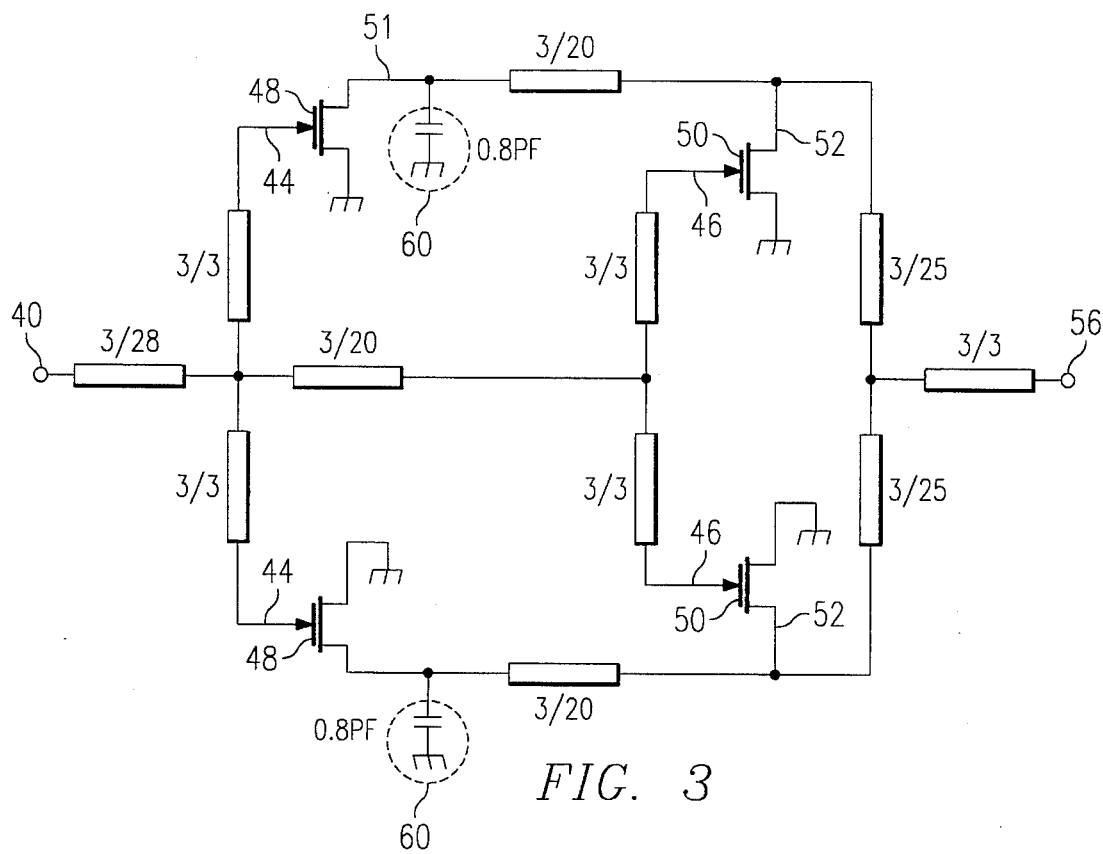
FIG. 3 is a schematic diagram of a reactively compensated power amplifier circuit in accordance with a first embodiment of the present invention.

In accordance with the present invention, the problem of the phase velocity difference is overcome by reactively compensating one of the routes. FIG. 3 is a modified schematic diagram of the circuit of FIG. 2. In FIG. 3, the widths and lengths of the microstrip transmission lines of FIG. 2 are indicated in units of mils (thousandths of an inch). For example, the line from the input port 40 to the input terminal 44 of the first pair of transistors 48 is 3 mils in width and 28 mils in length. The phase velocity difference between the routes from the input port 40 to output port 56 is addressed by adding, a capacitance 60 has been added in shunt on the output of the first pair of transistors 48.

Figure 4:
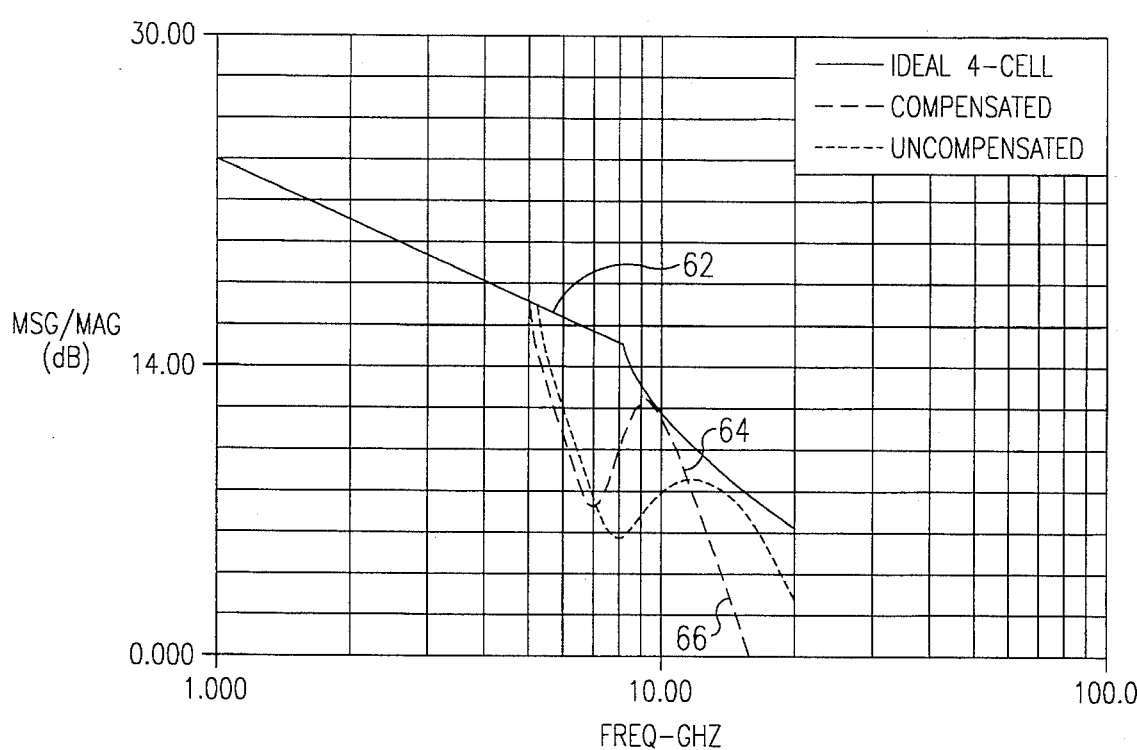
FIG. 4 is a plot of Gain vs. Frequency for the embodiment of FIG. 3 and two other power amplifier circuit configurations.

FIG. 4 shows the effect of the reactive compensation on the circuit performance. The maximum stable gain and maximum available gain are plotted against frequency for an "ideal four-cell" layout 62, a "compensated" configuration 64, and an "uncompensated" configuration 66. The ideal four-cell layout is the circuit of FIG. 3, but with the line lengths set to zero thereby eliminating phase differences between any paths in the circuit. This represents the best theoretical performance, but is physically unrealizable in conventional integrated circuit technology. The uncompensated plot is the circuit of FIG. 2, i.e. with no reactive compensation. The compensated plot is the circuit of FIG. 3 with the capacitor 60 as reactive compensation. The frequency band of interest for this particular embodiment is X-band (8.0 to 12.5 GHz). Inspection of the plots of FIG. 4 shows that the reactively compensated circuit has a peak in its gain performance in X-band. Thus, a phase differential between paths in the compact layout of FIG. 2 is effectively compensated at X-band frequencies by adding the capacitor 60.

Figure 5:
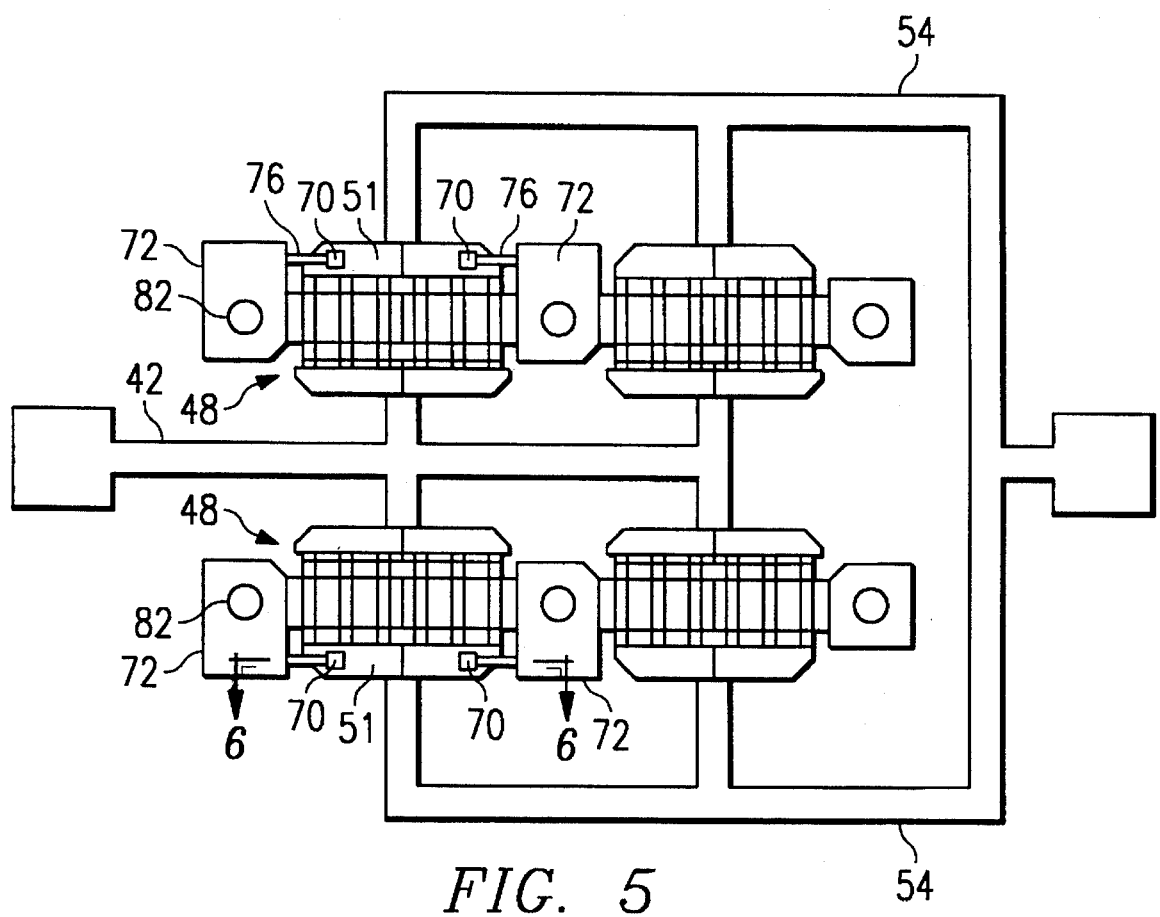
FIG. 5 is a plan view of an integrated circuit implementation of the embodiment circuit of FIG. 3.
Figure 6:
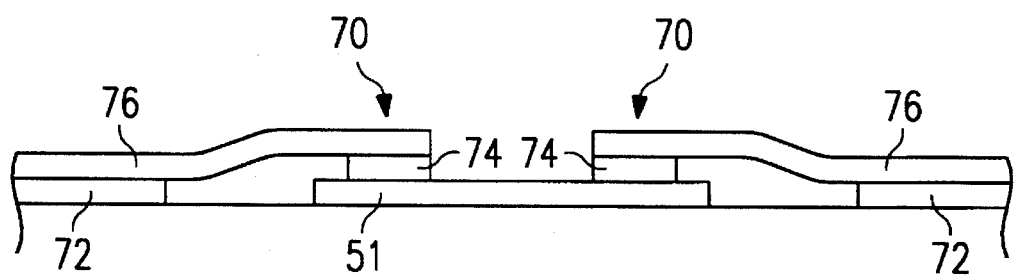
FIG. 6 is a cross-sectional view of the capacitors of the circuit of FIG. 5.

In FIG. 5 the capacitance 60 of FIG. 3 is implemented by small metal-insulator-metal capacitors 70. In this embodiment the capacitors are formed on the plated output terminal 51 of the transistor pair 48. The metallization used to form the output terminals can include a metal composite such as evaporated Ti/Pt/Au, plated with Au for example. A cross-sectional view of the capacitor arrangement is shown in FIG. 6. The transistor output terminal 51 serves as the bottom plate of the capacitor. A dielectric 74, such as $Si_3N_4$ for example, is then patterned over the bottom plate. It may be appreciated that the value of the capacitor 70 is dependent upon the thickness of the dielectric 74 and the area covered by the dielectric 74 and the top plate formed by airbridge 76, which serves to connect the capacitor to the source terminal 72. Airbridge 76 may be formed by first depositing a patterned spacer layer such as $Si_3N_4$ to define the arch of the bridge, and then plating a layer of Au over the spacer layer. This embodiment is a common source configuration, and hence source pad 72 is connected to a ground plane on the backside of the semiconductor substrate on which the circuit is fabricated by plated via hole 82.

Figure 7:
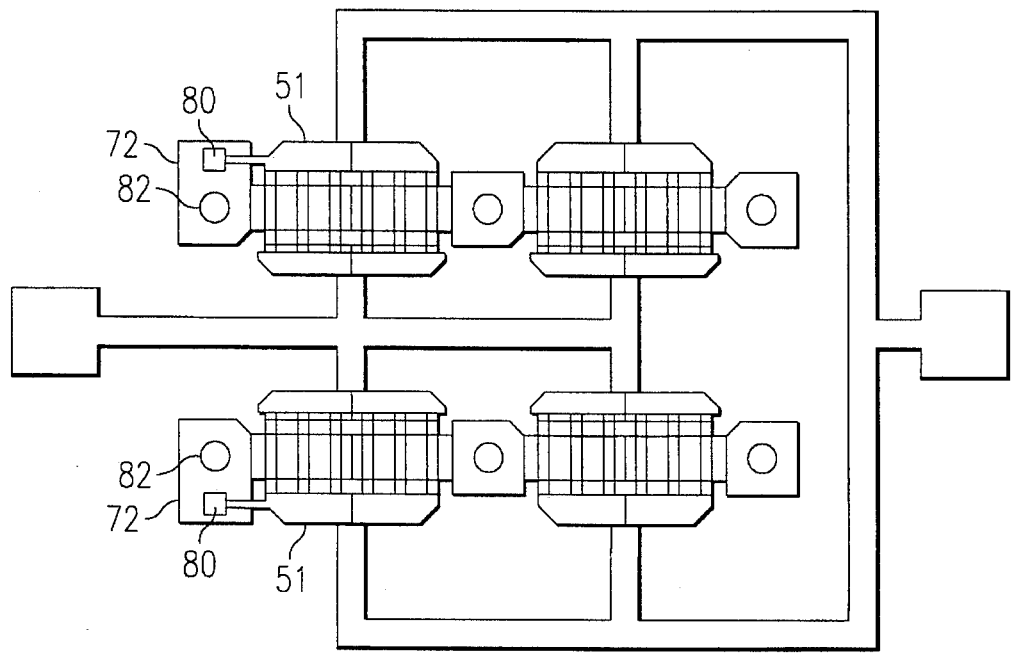
FIG. 7 is a plan view of a second integrated circuit implementation of the embodiment of FIG. 3.

In this embodiment the dielectric 74 is $Si_3N_4$ and is approximately 2000 521 in thickness. The capacitance per square mil of this dielectric thickness is approximately 0.192 pF. The amount of capacitance used to produce the performance shown in FIG. 4 is approximately 0.8 pF with the line widths and lengths indicated. Therefore, the capacitor occupies an area of approximately 4 $mil^2$. The arrangement shown in FIG. 5 divides the capacitance into two approximately 2.0 $mil^2$ capacitors 70. An alternative arrangement shown in FIG. 7 incorporates a single capacitor 80 that is approximately 4 $mil^2$. In this embodiment the capacitor is constructed over the source pad 72. The airbridge from the top plate of the capacitor 80 is connected to the output terminal 51 of the first pair of transistors 48. The grounded source terminal 72 will typically be larger in area than the output terminal 51 in order to accommodate the via hole 82. This in turn allows for a larger capacitor 80 than in the implementation shown in FIG. 5.

Bipolar transistors, particularly heterojunction bipolar transistors, are characterized by a lower input capacitance than output capacitance. This is the opposite situation from that described above for MESFETs. The compensation for a bipolar circuit is similar to that for FET circuits, except that the reactive compensation is added to the input terminal of the first pair of transistors 48 of a bipolar circuit, instead of to the output. Additionally, there may be instances where the reactive compensation needed to equalize the phase velocity between two branches of a circuit is inductive rather than capacitive.

Figure 8:
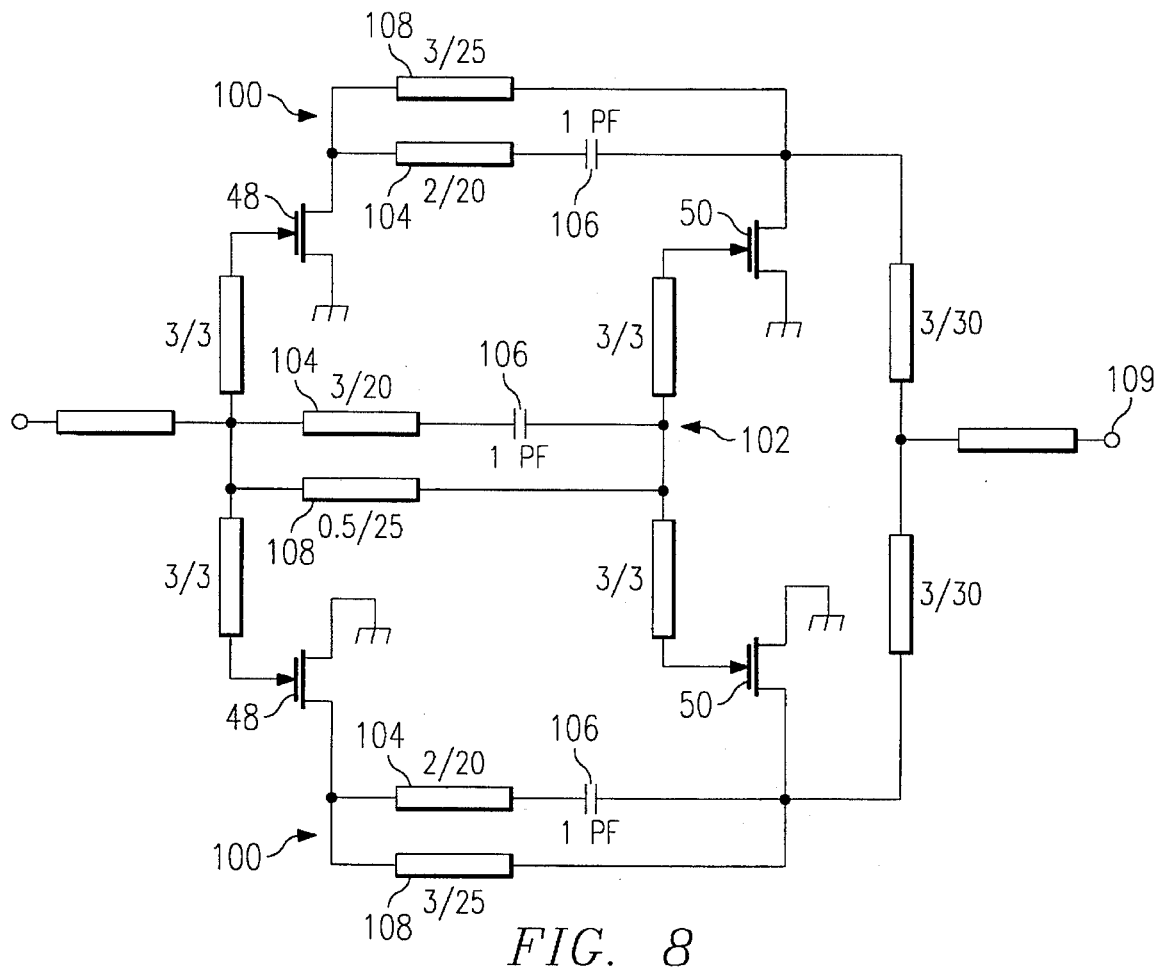
FIG. 8 is a schematic diagram of a reactively compensated power amplifier circuit in accordance with a second embodiment of the present invention.

In another embodiment of the invention, the problem of phase velocity difference between routes through the transistor circuit is approached through the use of series-resonant circuits. FIG. 8 is a schematic diagram of the circuit of FIG. 2, except that series resonant circuits 100 and 102 have replaced the transmission lines connecting the input 44 and output 51 terminals of the first 48 and second 50 pairs of transistors. A benefit of a series-resonant circuit is that there is no appreciable phase change between the input and output of the resonant network. In other words, the circuit presents a short circuit to a signal at the resonant frequency of the network. For example, the network comprising the 3-mil-wide, 20-mil-long microstrip line 104 and the 1 pF capacitor 106 in FIG. 8 is series-resonant at approximately 9.0 GHz. Therefore, with regard to phase change, that entire network appears as a short circuit at 9.0 GHz. A similar situation occurs for the other resonant networks 100. These circuits essentially eliminate the source of the phase differential that hinders the performance of the circuit of FIG. 2. With the phase differences eliminated (at least at the resonant frequency and for a narrow band around that frequency), the signals at the output of the transistors combine in phase to produce the highest power possible for a given bias condition and frequency at the circuit output port 109. Because the series resonant circuit comprises a series capacitor, a DC bypass line 108 is provided in this embodiment to allow for a common bias supply to the gate and drain of the pairs of transistors 48 and 50.

Figure 9:
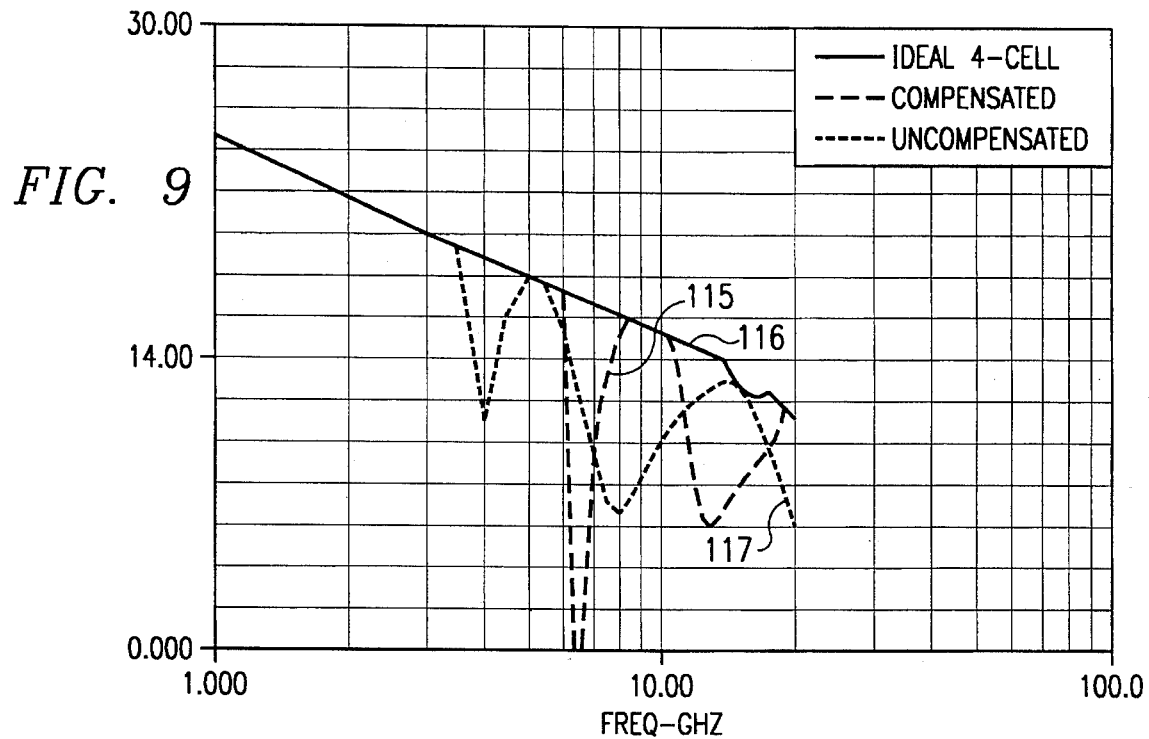
FIG. 9 is a plot of Gain vs. Frequency for the embodiment of FIG. 8 and two other power amplifier circuit configurations.

Modelled results of the embodiment "compensated" circuit 115 are shown in FIG. 9 and are compared to the aforementioned "ideal four-cell" circuit 116 and the "uncompensated" circuit 117. As in the first embodiment, the series resonant circuits essentially eliminate differences in phase velocity between the two transistor pairs over a narrow band of frequencies. The value of the capacitor 106 and the length and width of the transmission lines 104 can be adjusted to make the circuit have a performance peak at any desired frequency.

Figure 10:
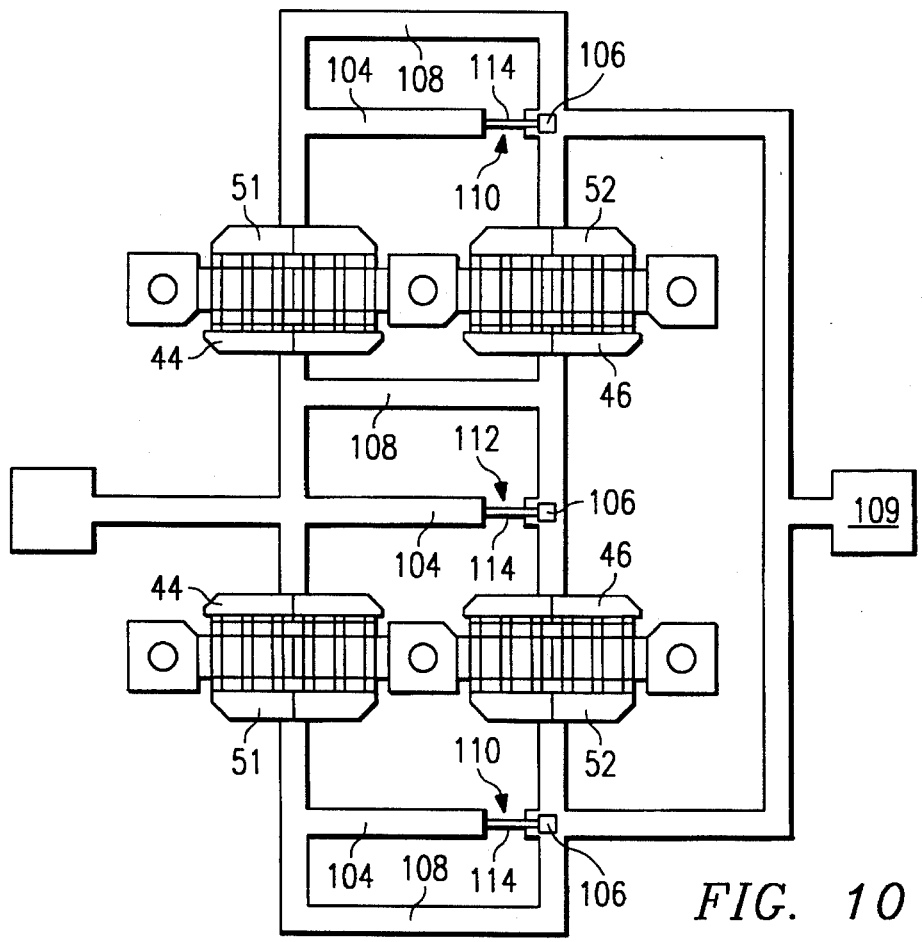
FIG. 10 is a plan view of an integrated circuit implementation of the embodiment of FIG. 8.

FIG. 10 shows an implementation of the series-resonant network feature. A gap 110, 112 is formed in the input and output transmission line networks. This gap may be formed through patterning of the line metallization during evaporation and plating of the line metallization, or by removal of the metallization after the line is formed. The capacitor 106 is formed on a section of the output transmission line network adjacent the gap, 110 or 112. The top plate of the capacitor 106 is connected by airbridge 114 to transmission line 104 as described hereinabove. The resonance of transmission lines 104 with capacitors 106 creates an apparent short circuit between the input and output terminals of the transistors. It may be appreciated that the resonant frequency of the series network is dependent upon the inductance of the transmission line 104 and also on the value of the capacitor 106. The inductance of the line 104 is in turn dependent upon its width and length. It should also be noted that the resonant circuit can be formed of circuit elements other than microstrip transmission lines and metal-insulator-metal capacitors. For example, off-chip elements such as wire coil inductors and capacitors that can be bonded to the integrated circuit could be used.

Figure 11:
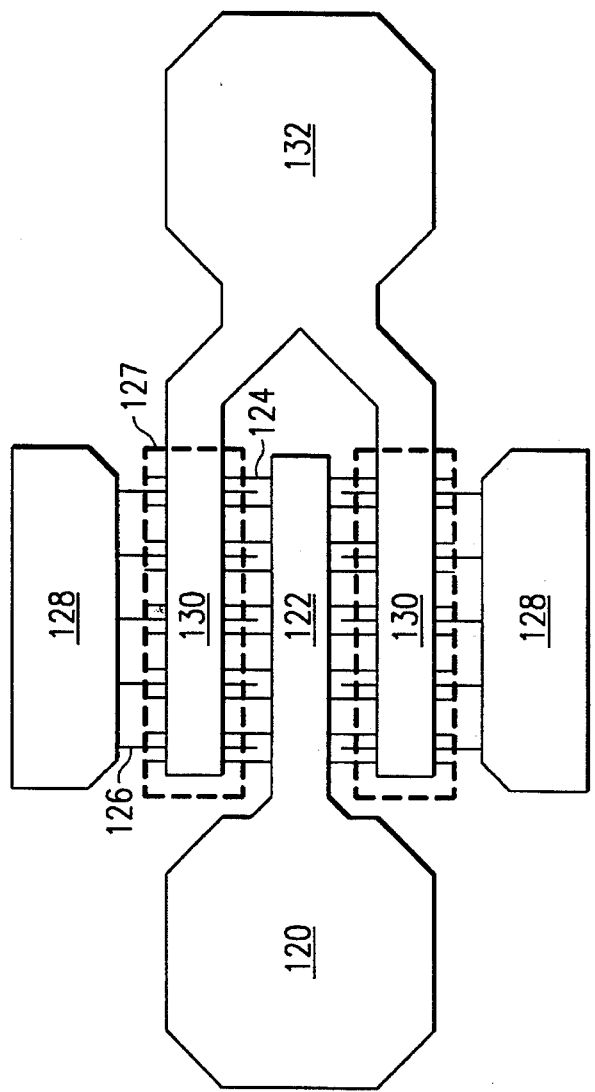
FIG. 11 is a plan view of a prior art heterojunction bipolar transistor.

Modern high performance microwave power transistors generally require the use of a large number of unit transistors connected in parallel. Referring now to FIG. 11, a unit transistor typically comprises an emitter finger 126 extending from an emitter pad 128 to the active region 127 (indicated by the dashed line), two base fingers 124 extending from a central input transmission line 122, and a collector bus 130 that contacts a collector region in the active region 127 adjacent to each base finger 124. The maximum number of such fingers (emitter/base/collector fingers for heterojunction bipolar transistors, source/gate/drain fingers for FET) is limited by such considerations as impedance level, junction temperature rise, and particularly the "distributed effect." Electrical and thermal considerations, such as hot-spotting and current hogging, have generally limited the unit emitter length of a heterojunction bipolar transistor to about 30–40 μm for X-band operation. Experiment and simulation have shown that the total emitter periphery that can be packed into a unit cell is about 300-μm (about ten 30-μm-long emitter fingers). This typically limits the output power of such a transistor to about 1 watt at X-band.

Operation of the transistor of FIG. 11 is generally as follows. A signal incident at the input port 120 propagates along input line 122. The signal enters the ten unit transistors (five on each side of the input line) shown in this example through base fingers 124. A bias current is set up between the emitter finger 126, connected to ground through vias (not shown) to a backside groundplane beneath emitter terminal 128, and the collector contact (not shown) of each of the unit transistors arranged along the input line 122. The emitter collector bias current is modulated by the signal on the base fingers 124, which results in amplification of the input signal. The amplified signal exits the unit transistors along the output transmission lines 130, which are coupled to the collector contacts of the unit transistors. The amplified signal propagates along the output transmission line 130 to the output port 132.

The center-fed, or pi, transistor configuration shown in FIG. 11 is used for both bipolar transistors and for field effect transistors (not shown). A problem with the center-fed configuration is that when the length of the input line 122 is an appreciable portion of a wavelength (approximately one-sixteenth of the guided wavelength of the signal or greater), phase interactions diminish the gain of the transistor. This is the so-called "distributed effect." Thus, in accordance with traditional design philosophy, the transistor must be kept small in size to preserve optimal phase and gain conditions. However, this is in direct conflict with the need for larger transistors which are necessary to produce high output power.

Figure 12:
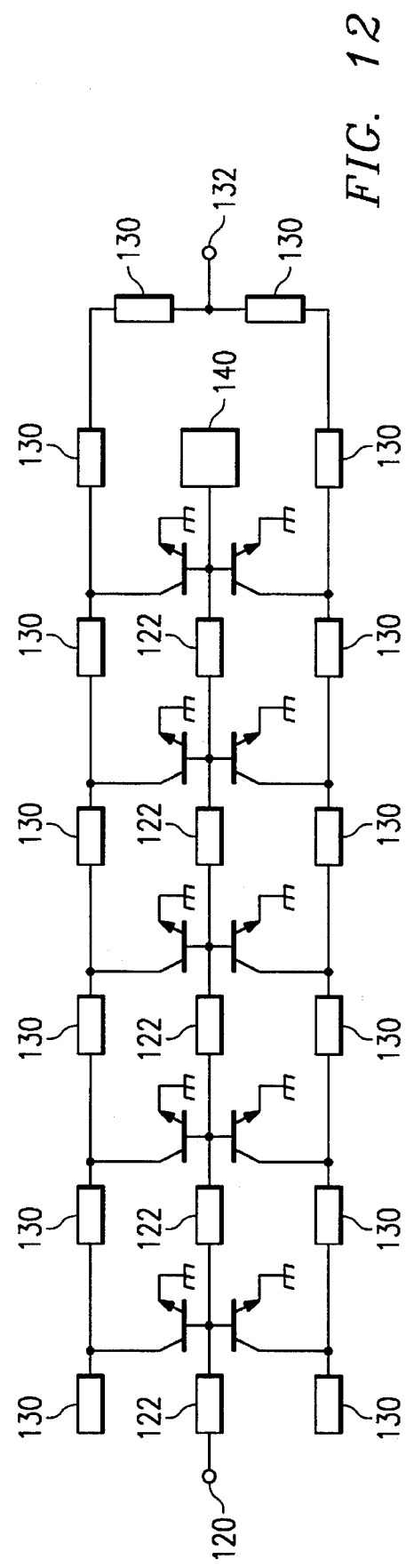
FIG. 12 is a schematic diagram of a reactively compensated transistor in accordance with the third embodiment of the present invention.
Figure 13:
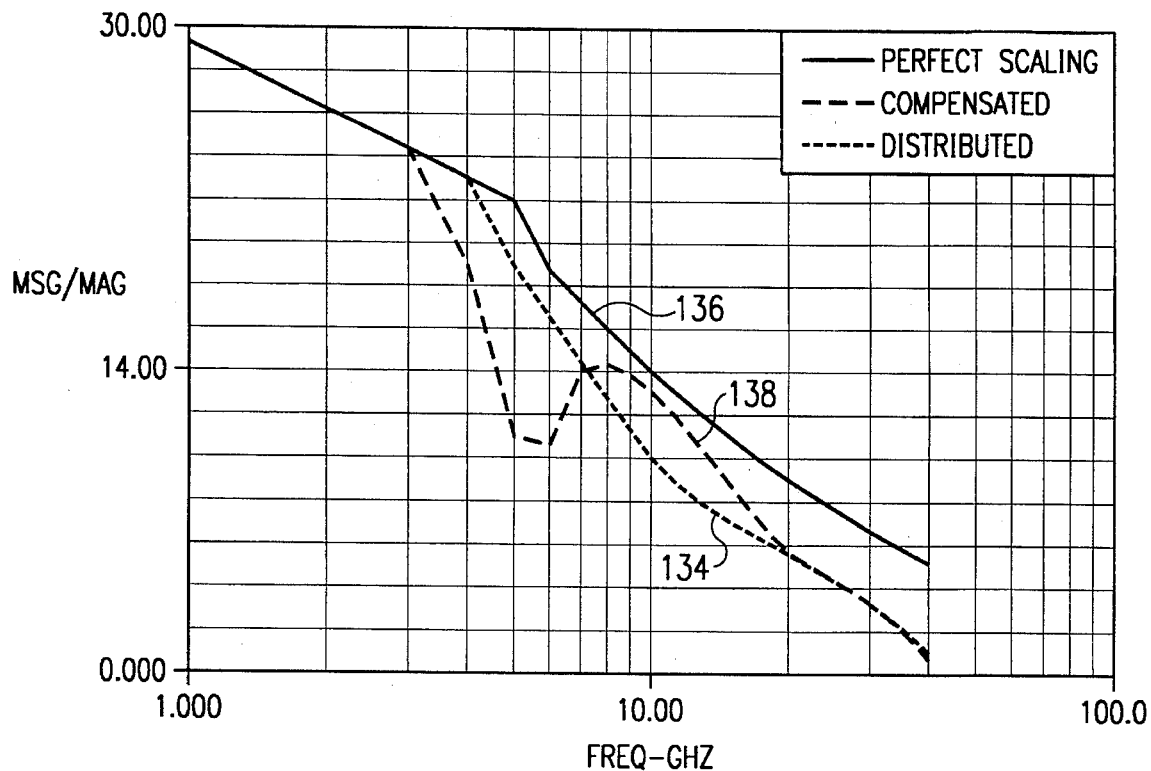
FIG. 13 is a plot of Gain vs. Frequency for the embodiment of FIG. 12 and two other power transistor configurations.

An example of the impact of the distributed effect on a bipolar transistor is shown in the performance plots of FIG. 13. The curve marked "distributed" 134 is the modelled performance of a transistor having a 40 μm unit emitter finger length and a total emitter periphery of 480 μm. In contrast, the curve marked "perfect scaling" 136 is the modelled performance of the 480 μm transistor shown in FIG. 11 if its performance scaled perfectly with size. It is apparent that the distributed effects of the large transistor result in a gain reduction of approximately 4 dB at 10 GHz. It may be appreciated that the distributed effect is negligible at frequencies much lower than X-band as the transistor behaves like a lumped element and more ideal device scaling is to be expected. Limited gain compensation (over a limited bandwidth) similar to that generally used for distributed amplifiers can be obtained by altering the transmission line length 122 and 130 between electrodes. However, such a scheme tends to increase the size of the transistor. An alternative approach is shown schematically in FIG. 12, where the circuit of FIG. 11 is modelled as transmission line segments 122, 130 serving to connect unit transistors. By using a simple reactive element 140, in this case a capacitor of approximately 8 pF, coupled between the open end of the base feed line 122 and ground, the degradation in gain due to the distributed effect can be minimized over a 20 to 30% bandwidth. The curve marked "compensated" 138 in FIG. 13 shows a modelled 3 dB improvement in gain at 10 GHz for the 480 μm transistor using an 8 pF capacitor as a termination of the input line 122.

Figure 14:
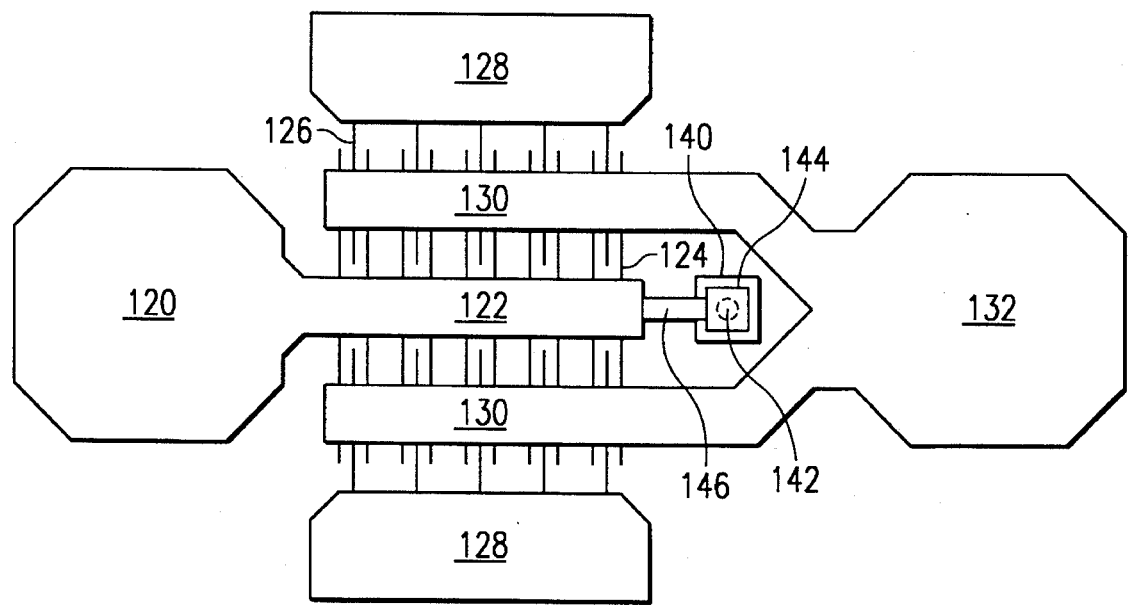
FIG. 14 is a plan view of an integrated circuit implementation of the embodiment of FIG. 12.

The reactive termination has the effect of reflecting part of the power at the end of the transistor's input line and thereby results in increased transistor gain. The capacitor may be fabricated using the metal-insulator-metal technique described hereinabove. A layout of an implementation of the metal-insulator metal capacitor 140 is shown in FIG. 14. The bottom plate of the capacitor 140 comprises metallization deposited over a via hole 142 through which the bottom plate is coupled to a groundplane on the backside of the semiconductor substrate on which the transistor is fabricated. The capacitor top plate 144 is formed over a layer of dielectric, in this embodiment a 2000 Å layer of $Si_3N_4$. Contact from the capacitor top plate to the input line 122 is made with a plated airbridge 146. It may be appreciated that the precise value of the capacitance that produces favorable gain performance is dependent upon the device size (i.e. number of fingers) and the frequency band of interest.

A few preferred embodiments have been described in detail hereinabove. It is to be understood that the scope of the invention also comprehends embodiments different from those described, yet within the scope of the claims.

Internal and external connections can be ohmic, capacitive, inductive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, although the common-emitter and common-source circuit configurations were used in the above embodiments, it may be appreciated that other configurations such as common-base, common-collector, common-gate and common-drain may also benefit from the invention. In addition, where the embodiments are described as being coupled to ground, it may be appreciated that a reference potential other than earth ground is also contemplated. Furthermore, the scope of the invention should be construed to include not only metal-insulator-metal capacitors that are integrated onto the substrate onto which the circuits are fabricated, but also includes off-chip capacitors. It is therefore intended that the appended claims encompass these and other such modifications or embodiments.

What is claimed is:

1. A transistor for amplifying a high-frequency signal, said transistor comprising:

a plurality of unit transistors arranged along opposite sides of an input transmission line, each of said unit transistors including an input terminal and an output terminal;

said input transmission line coupling each of said input terminals to one another and to a reactive termination; and output transmission lines arranged along opposite sides of said input transmission line coupling each of said output terminals to one another.

2. The transistor of claim 1 wherein said reactive termination is a capacitor.

3. The transistor of claim 2 wherein said capacitor is a metal-insulator-metal structure having a bottom plate coupled to ground and a top plate coupled to said input transmission line.

4. The transistor of claim 1 wherein each of said unit transistors includes a gate terminal having a periphery, and wherein a total gate periphery of said plurality of unit transistors is less than 300 μm.

5. The transistor of claim 1 wherein each of said unit transistors includes an emitter terminal having a periphery, and wherein a total emitter periphery of said plurality of unit transistors is less than 300 μm.

6. The transistor of claim 1 wherein the length from a first unit transistor to a last unit transistor along said input transmission line is greater than approximately one-sixteenth of the wavelength of said high-frequency signal.

7. A transistor for amplifying a high-frequency signal, said transistor comprising:

a) a plurality of unit transistors, each of said unit transistors including an input terminal and an output terminal;

b) an input transmission line coupling each of said input terminals to one another and to a shunt capacitor at an end of said input transmission line, wherein said shunt capacitor comprises:
  i) a bottom plate formed over a via hole providing coupling from said bottom plate to a groundplane on the backside of a semiconductor substrate;
  ii) a layer of dielectric material separating said bottom plate from a top plate; and
  iii) an airbridge coupling said top plate to said input transmission line; and
c) an output transmission line coupling each of said output terminals to one another.

8. The transistor of claim 7 wherein said transistor is fabricated on a gallium arsenide substrate.

9. The transistor of claim 7 wherein said unit transistors are field effect transistors and said input terminals are gate terminals.

10. The transistor of claim 7 wherein said unit transistors are bipolar transistors and said input terminals are base terminals.

11. A method of fabricating a transistor for amplifying a high-frequency signal, said method comprising the steps of:
  forming a plurality of unit transistors along opposite sides of an input transmission line, each of said unit transistors including an input terminal and an output terminal;
  coupling said input transmission line to each of said input terminals and to a reactive termination; and
  coupling output transmission lines along opposite sides of said input transmission line and to each of said output terminals.

12. The method of claim 11 wherein said step of coupling an input transmission line to a reactive termination further comprises forming a capacitor at an end of said transmission line.

13. The method of claim 12 wherein said step of forming a capacitor includes forming a metal-insulator-metal structure having a bottom plate coupled to ground and a top plate coupled to said input transmission line.

14. The method of claim 12 wherein said step of forming a capacitor includes the further steps of:
  forming a groundplane on the backside of a semiconductor substrate;
  forming a bottom plate by forming metallization over a via hole through which said bottom plate is coupled to said groundplane;
  forming dielectric over said bottom plane;
  forming a top plate over said dielectric; and
  forming an airbridge from said input transmission line to said top plate.

15. The method of claim 14 wherein said step of forming dielectric comprises depositing $Si_3N_4$.

* * * * *